United States Patent [19]

Iwata et al.

[11] Patent Number: 5,355,531
[45] Date of Patent: Oct. 11, 1994

[54] SQUELCH CIRCUIT FOR VOLUME CONTROL OF A RADIO TRANSMITTER AND RECEIVER

[75] Inventors: Yoshihiro Iwata, Saitama; Mitsuo Shiraishi, Tokyo, both of Japan

[73] Assignee: Hitachi Denshi Kabushiki Kaisha, Tokyo, Japan

[21] Appl. No.: 928,939

[22] Filed: Aug. 11, 1992

[30] Foreign Application Priority Data

Aug. 12, 1991 [JP] Japan .................. 3-225327

[51] Int. Cl.⁵ .............................................. H04B 1/10
[52] U.S. Cl. ................ 455/219; 455/232.1; 381/109
[58] Field of Search .............. 455/212, 218, 219, 220, 455/174.1, 194.1, 194.2, 200.1, 232.1, 355; 381/109, 107; 375/104; 330/278; 348/632, 738

[56] References Cited

U.S. PATENT DOCUMENTS

| | | | |
|---|---|---|---|
| 3,496,481 | 2/1970 | Torick et al. | 455/219 |
| 3,714,579 | 1/1973 | Valdes et al. | 455/355 |
| 4,683,386 | 7/1987 | Kamikawara | 455/219 X |
| 5,130,665 | 7/1992 | Walden | 381/109 X |

*Primary Examiner*—Edward F. Urban
*Attorney, Agent, or Firm*—Hecker & Harriman

[57] ABSTRACT

A squelch circuit for a radio transmitter/receiver includes an amplifier, a digitally-controlled electronic volume control, a volume adjusting variable resistor, and a volume controller. The amplifier amplifies a received audio signal input and provides the received audio signal to a loudspeaker. The digitally-controlled electronic volume control changes the output level of the amplifier. The volume adjusting variable resistor outputs data representing a volume value. The volume controller constantly detects changes in volume value data output from the variable resistor, and controls an attenuation amount of the digitally-controlled electronic volume control in accordance with the volume value represented by the variable resistor. While in a "mute" state, this volume control continues until a predetermined time has elapsed since the detection of the change in volume value data. The volume controller then sets the attenuation amount of the digitally-controlled electronic volume control to an infinite attenuation amount.

12 Claims, 1 Drawing Sheet

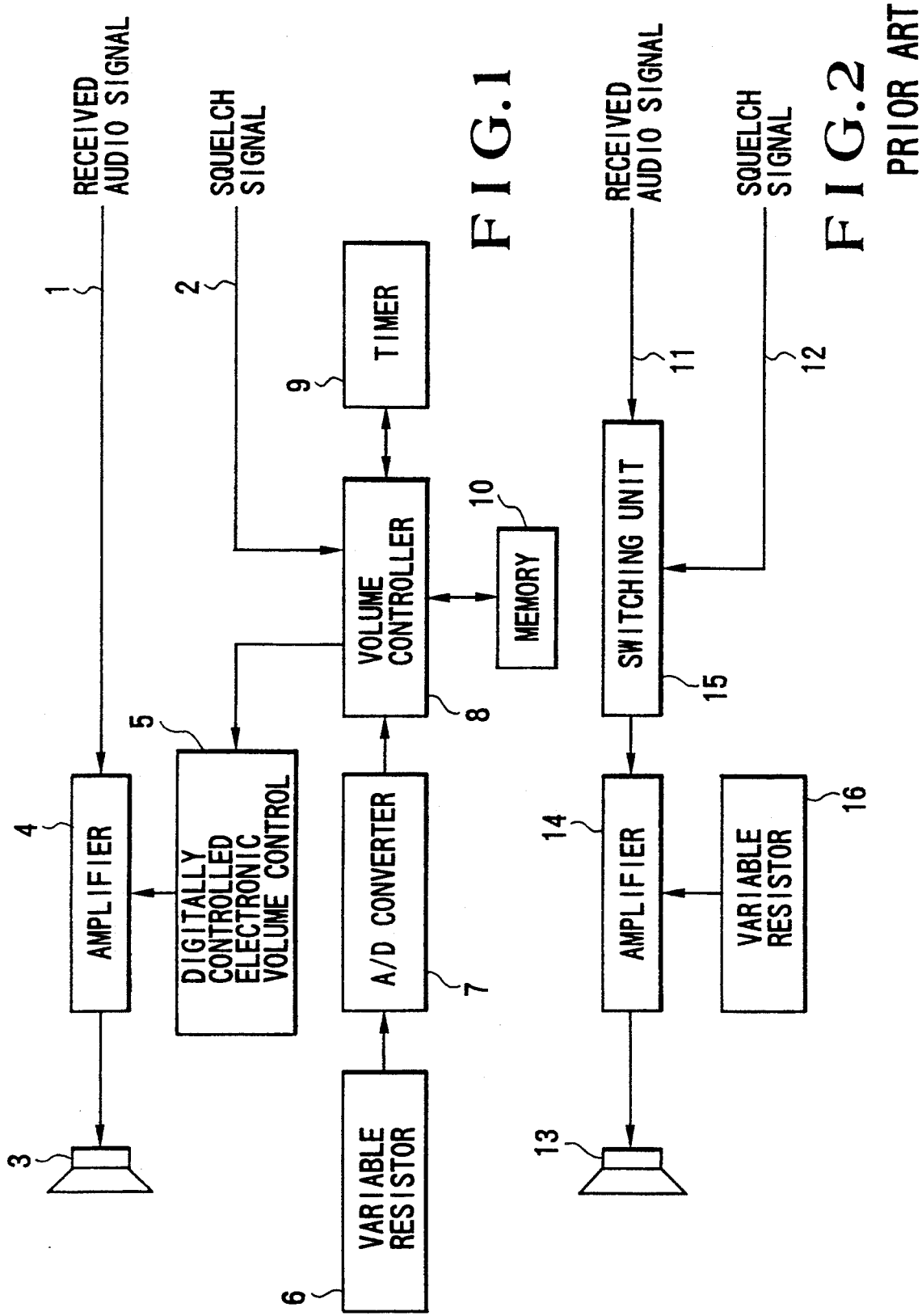

SQUELCH CIRCUIT FOR VOLUME CONTROL OF A RADIO TRANSMITTER AND RECEIVER

BACKGROUND OF THE INVENTION

1. Field of the Invention

The present invention relates to a squelch circuit for a transmitter/receiver, especially an FM radio transmitter/receiver, and, more particularly, to a squelch circuit that outputs a signal for a predetermined length of time, although the squelch signal is set in a "mute" state, thereby allowing an operator to adjust the volume while listening to sounds produced from a loudspeaker.

2. Background Art

A conventional squelch circuit is described below with reference to FIG. 2. In this squelch circuit, as shown in FIG. 2, received audio signal 11 is input to switching unit 15 and enabled/disabled by squelch signal 12. Received audio signal 11 is disconnected when squelch signal 12 is set in a "mute" state, and the received audio signal 11 is output to amplifier 14 when squelch signal 12 is set in a "non-mute" state. Received audio signal 11 is amplified by amplifier 14 to a volume level that is adjustable via variable resistor 16. Received audio signal 11 is then output to loudspeaker 13.

In a conventional squelch circuit, although an operator can adjust the volume controller (consisting of variable resistor 16) while listening to sounds from loudspeaker 13 in a "non-mute" state, i.e., a radio wave receiving state, the operator cannot adjust the volume controller while listening to sounds in a "mute" state. For this reason, when the volume controller is adjusted while in a "mute" state, the volume controller is roughly adjusted according to the scale of variable resistor 16. In another method, a squelch volume control in the squelch circuit is manually set in a "non-mute" state temporarily, so that the volume is controlled by variable resistor 16. Then, the squelch volume control is adjusted to be set in a "mute" state again. This last method is inconvenient for the user.

Volume adjustments in a mute state must be frequently performed when using a radio transmitter/receiver. For example, immediately after the radio transmitter/receiver is turned on, it has an unknown volume value. Also, when the variable resistor 16 is changed while in a "mute" state, the adjustment position in a "non-mute" state becomes unknown.

SUMMARY OF THE PRESENT INVENTION

It is an object of the present invention to provide a squelch circuit in which an operator can adjust the volume while listening to sounds, even if a squelch signal is set in a "mute" state.

In order to achieve the above object, according to the present invention, there is provided a squelch circuit comprising: an amplifier for amplifying a received audio signal, and providing the amplified audio signal to a loudspeaker; a digitally-controlled electronic volume control for changing the output level of the amplifier; a volume adjusting variable resistor for providing a signal representing a volume value; and volume control means for constantly detecting changes in the volume value signal provided by the variable resistor and controlling the attenuation amount of the digitally-controlled electronic volume control in accordance with the volume value provided by the variable resistor. When the squelch signal is set in a "mute" state, the volume control means operate in accordance with the variable resistor until a predetermined time has elapsed. After the predetermined time has elapsed, the volume control means sets the attenuation value of the digitally-controlled electronic volume control to a substantially infinite attenuation value.

BRIEF DESCRIPTION OF THE DRAWINGS

FIG. 1 is a block diagram showing a squelch circuit according to an embodiment of the present invention.

FIG. 2 is a block diagram showing a conventional prior art squelch circuit.

DETAILED DESCRIPTION OF THE INVENTION

An embodiment of the present invention will be described below with reference to FIG. 1.

FIG. 1 shows a squelch circuit according to the preferred embodiment of the present invention. In FIG. 1, reference numeral 1 denotes a received audio signal of a radio transmitter/receiver; reference numeral 2 denotes a squelch signal generated by an external circuit in accordance with the presence/absence of the received audio signal 1; reference numeral 3 denotes a loudspeaker; reference numeral 4 denotes an amplifier for amplifying the receiving audio signal to output it to the loudspeaker; reference numeral 5 denotes a digitally-controlled electronic volume control for variably setting the gain of the amplifier 4; reference numeral 6 denotes a variable resistor for adjusting the volume by an operation of the user; reference numeral 7 denotes an A/D converter for converting, from analog to digital, an output from the variable resistor; reference numeral 8 denotes a volume controller for controlling the digitally-controlled electronic volume control 5 using the squelch signal 2 and an output from the A/D converter 7 as inputs; reference numeral 9 denotes a timer connected to the volume controller 8; and reference numeral 10 denotes a memory accessed by the volume controller 8.

Operation of the squelch circuit will be described below. The received audio signal 1 is input to amplifier 4 and amplified or attenuated by amplifier 4 in accordance with a volume value set by the digitally-controlled electronic volume control 5. The output of amplifier 4 is then provided to loudspeaker 3. Volume controller 8 performs the following control operations depending on the states of the squelch signal 2.

When squelch signal 2 is set in a "non-mute" state, the volume value of the variable resistor 6 is converted into a digital signal by A/D converter 7, and the digital signal is provided to volume controller 8. This input volume value is updated and stored in memory 10, and at the same time, an attenuation amount corresponding to the volume value is set in the digitally-controlled electronic volume control 5. The above control operation is repeated at predetermined intervals while in the "non-mute" state, thus an operator can adjust the volume while listening to sounds from loudspeaker 3.

On the other hand, when squelch signal 2 is set in a "mute" state, as in the "non-mute" state, the volume value of variable resistor 6 is converted into a digital signal by A/D converter 7, and the digital signal is input into volume controller 8. The volume value previously stored in the memory 10 is read out therefrom and compared with the input volume value. As a result, when the two volume values coincide with each other, i.e., when the volume value has not changed, a substantially infinite attenuation value is set in the digitally-controlled electronic volume control 5, and the received audio signal 1 is attenuated ("mute" state). When the two values do not coincide with each other, i.e., when the volume value has changed, the changed volume value of variable resistor 6 is stored in memory 10 to update the storage contents. At the same time, the timer 9 is controlled to measure a predetermined time, and an attenuation amount corresponding to the changed volume value is set in the digitally-controlled electronic volume control 5.

When the volume value of variable resistor 6 is further changed within the predetermined time, the changed volume value is stored in memory 10 to update the storage contents as in the above operation, and timer 9 is restarted (time is prolonged), thereby setting an attenuation amount corresponding to the changed volume value in the digitally-controlled electronic volume control 5.

According to the above operation, even in a "mute" state, during a predetermined time after the volume value is changed, the received audio signal 1 is output ("non-mute" state) in accordance with the volume value. Therefore, an operator can adjust the volume while listening to sounds from the loudspeaker.

If the predetermined time has elapsed and the volume value of variable resistor 6 has not changed, a substantially infinite attenuation amount is set in the digitally-controlled electronic volume control 5 to attenuate the received audio signal 1 ("mute" state). According to this control operation, when the volume adjustment is finished, the received audio signal 1 can automatically restore a "mute" state.

However, in the comparison of the volume values, a volume value may be changed due to a conversion error in A/D converter 7 or noise produced by sliding variable resistor 6. In order to prevent the error from being regarded as a change in volume value, the error caused by the conversion error or noise is considered when the volume values are compared with each other, and the volume is considered to have been adjusted when the change in volume value is larger than the error.

As described above, in a squelch circuit according to the present invention, when a volume is adjusted, even if a squelch signal is a set in a "mute" state, since the squelch circuit is set in a "non-mute" state for a predetermined time, an operator can adjust the volume while listening to sounds from the loudspeaker. Therefore, a predetermined volume can be set without using the scale of a variable resistor.

We claim:

1. A squelch circuit for volume control of a radio transmitter/receiver, comprising:
   amplifying means coupled to a loudspeaker for amplifying a received audio signal input, said amplifying means providing an amplified audio signal to said loudspeaker;
   a digitally-controlled electronic volume control coupled to said amplifying means for changing an output level of said amplified audio signal;
   variable resistor means coupled to a volume control means for providing a volume value to said volume control means for controlling said digitally-controlled electronic volume control and for controlling said output level of said amplified audio signal;
   means for providing a squelch signal to said volume control means; and
   said volume control means, coupled to said digitally-controlled electronic volume control, comprises means for detecting a change in said volume value provided by said variable resistor means and means for changing said output level of said amplified audio signal via said digitally controlled electronic volume control in response to said squelch signal and said change in said volume value, said squelch signal being selectively set to a mute state or a non-mute state to disable or enable said amplifying means, respectively,
   wherein said digitally-controlled electronic volume control changes said output level of said amplified audio signal in response to said volume value from said variable resistor means when said squelch signal is in said non-mute state, and changes said output level of said amplified audio signal in response to said volume value from said variable resistor means during a predetermined time interval when said squelch signal is in said mute state and said change in said volume value from said variable resistor means is detected and, said digitally-controlled electronic volume control disables said amplifying means when said predetermined time interval has expired.

2. A circuit according to claim 1 wherein said volume control means controls an attenuation value of said digitally-controlled electronic volume control in response to said volume value provided by said variable resistor means when said squelch signal is set in said non-mute state.

3. A circuit according to claim 1 wherein said volume control means controls said digitally-controlled electronic volume control in response to said change in said volume value and measures said predetermined time again when a change in volume value provided by said variable resistor means is detected before said predetermined time has elapsed.

4. A circuit according to claim 1 further comprising a memory for updating and storing at every predetermined interval said volume value provided by said variable resistor means, and wherein said volume control means compares said volume value from said variable resistor means with said volume value stored in said memory to detect said change in volume value data from said variable resistor means.

5. A circuit according to claim 1 further comprising an A/D converter for converting an analog volume value provided by said variable resistor means into a digital volume value.

6. A circuit according to claim 1 wherein said digitally-controlled electronic volume control is controlled to a substantially infinite attenuation amount when said squelch signal is in said mute state after said predetermined time has elapsed.

7. A squelch circuit for volume control of a radio transmitter/receiver, comprising:
   amplifying means coupled to a loudspeaker for amplifying a received audio signal input, said amplifying means providing an amplified audio signal to said loudspeaker;
   a digitally-controlled electronic volume control coupled to said amplifying means for changing an output level of said amplified audio signal;
   variable resistor means coupled to a volume control means for providing a volume value to said volume control means for controlling said digitally-controlled electronic volume control and for controlling said output level of said amplified audio signal;

means for providing a squelch signal to said volume control means; and said volume control means, coupled to said digitally-controlled electronic volume control, comprises means for detecting a change in said volume value provided by said variable resistor means and means for changing said output level of said amplified audio signal via said digitally controlled electronic volume control in response to said squelch signal and said change in said volume value, said squelch signal being selectively set to a mute state or a non-mute state to disable or enable said amplifying means, respectively, wherein said digitally-controlled electronic volume control changes said output level of said amplified audio signal in response to said volume value from said variable resistor means when said squelch signal is in said non-mute state, and changes said output level of said amplified audio signal in response to said volume value from said variable resistor means during a predetermined time interval when said squelch signal is in said mute state and said change in said volume value from said variable resistor means is detected and, said digitally-controlled electronic volume control disables said amplifying means when said predetermined time intervals has expired; and a timer started when said change in said volume value provided by said variable resistor means is detected by said volume control means, said timer measuring said predetermined time.

8. A circuit according to claim 7 wherein said volume control means controls an attenuation value of said digitally-controlled electronic volume control in response to said volume value provided by said variable resistor means when said squelch signal is set in said non-mute state.

9. A circuit according to claim 7 wherein said volume control means controls said digitally-controlled electronic volume control in response to said change in said volume value and measures said predetermined time again when a change in volume value provided by said variable resistor means is detected before said predetermined time has elapsed.

10. A circuit according to claim 7 further comprising a memory for updating and storing at every predetermined interval said volume value provided by said variable resistor means, and wherein said volume control means compares said volume value provided by said variable resistor means with said volume value stored in said memory to detect said change in volume value data from said variable resistor means.

11. A circuit according to claim 7 further comprising an A/D converter for converting an analog volume value provided by said variable resistor means into a digital volume value.

12. A circuit according to claim 7 wherein said digitally-controlled electronic volume control is controlled to a substantially infinite attenuation amount when said squelch signal is in said mute state after said predetermined time has elapsed.

* * * * *